United States Patent
Fukushima et al.

(10) Patent No.: US 6,846,694 B2
(45) Date of Patent: Jan. 25, 2005

(54) SEMICONDUCTOR DEVICE WITH BUILT-IN LIGHT RECEIVING ELEMENT, PRODUCTION METHOD THEREOF, AND OPTICAL PICKUP INCORPORATING THE SAME

(75) Inventors: Toshihiko Fukushima, Nara (JP); Kazuhiro Natsuaki, Sakurai (JP); Takao Setoyama, Kawasaki (JP); Yuji Asano, Kawasaki (JP); Morio Katou, Kawasaki (JP)

(73) Assignees: Sharp Kabushiki Kaisha, Osaka (JP); Fujitsu Limited, Kanagawa (JP)

( * ) Notice: Subject to any disclaimer, the term of this patent is extended or adjusted under 35 U.S.C. 154(b) by 0 days.

(21) Appl. No.: 10/384,774

(22) Filed: Mar. 11, 2003

(65) Prior Publication Data

US 2003/0168658 A1 Sep. 11, 2003

(30) Foreign Application Priority Data

Mar. 11, 2002 (JP) .......................... 2002-066125

(51) Int. Cl.$^7$ .................... H01L 21/00; H01L 27/14; H01L 31/00
(52) U.S. Cl. ..................... 438/57; 438/73; 257/446; 257/184; 257/431; 385/49; 372/46
(58) Field of Search .................... 438/57, 73; 257/446, 257/184, 431; 385/49; 372/46

(56) References Cited

U.S. PATENT DOCUMENTS

| | | | | |
|---|---|---|---|---|
| 5,602,415 A | * | 2/1997 | Kubo et al. .............. | 257/443 |
| 5,793,913 A | * | 8/1998 | Kovacic ................... | 385/49 |
| 5,893,727 A | * | 4/1999 | Lau et al. ................ | 438/125 |
| 6,096,581 A | * | 8/2000 | Zhang et al. ............. | 438/149 |
| 6,252,286 B1 | * | 6/2001 | Arai ......................... | 257/446 |
| 6,380,603 B1 | * | 4/2002 | Takimoto et al. ......... | 257/463 |
| 6,689,682 B1 | * | 2/2004 | Ogle et al. ............... | 438/636 |

FOREIGN PATENT DOCUMENTS

JP    2000-133833    5/2000

* cited by examiner

*Primary Examiner*—Long Pham
*Assistant Examiner*—Shrinivas H. Rao
(74) *Attorney, Agent, or Firm*—Nixon & Vanderhye P.C.

(57) ABSTRACT

A method for producing a semiconductor device with a built-in light receiving element is provided. The device comprises a light receiving element region for receiving and converting an optical signal to an electric signal, the light receiving element region being provided on a substrate. The method comprises the steps forming an anti-reflection film in the light receiving element region on the substrate, and forming a protection film, the protection film serving as an etch stop film in a subsequent etching step.

17 Claims, 5 Drawing Sheets

SEMICONDUCTOR DEVICE WITH BUILT-IN LIGHT RECEIVING ELEMENT, PRODUCTION METHOD THEREOF, AND OPTICAL PICKUP INCORPORATING THE SAME

CROSS-REFERENCE TO RELATED APPLICATIONS

This application is based upon and claims the benefit of priority from the prior Japanese Patent Application No. 2002-066125, filed Mar. 11, 2002, the entire contents of which are incorporated herein by reference.

BACKGROUND OF THE INVENTION

1. Field of the Invention

The present invention relates to a method for producing a semiconductor device with a built-in light receiving element in which a light receiving element for converting an optical signal to an electric signal and a circuit element for processing the electric signal obtained by the light receiving element are provided on the same substrate. The present invention also relates to a semiconductor device with a built-in light receiving element produced by such a method. The present invention also relates to an optical pickup incorporating the semiconductor device with a built-in light receiving element.

2. Description of the Related Art

As a pickup or the like, a semiconductor device with a built-in light receiving element is used, in which a light receiving element for converting an optical signal to an electric signal and a circuit element for processing the electric signal obtained by the light receiving element are provided on the same substrate. Such a semiconductor device with a built-in light receiving element is produced by integrating a photodiode (light receiving element) with circuitry for signal processing (e.g., a transistor, a resistor, a capacitor, and the like) on the same chip by utilizing IC processes.

Figure 5:
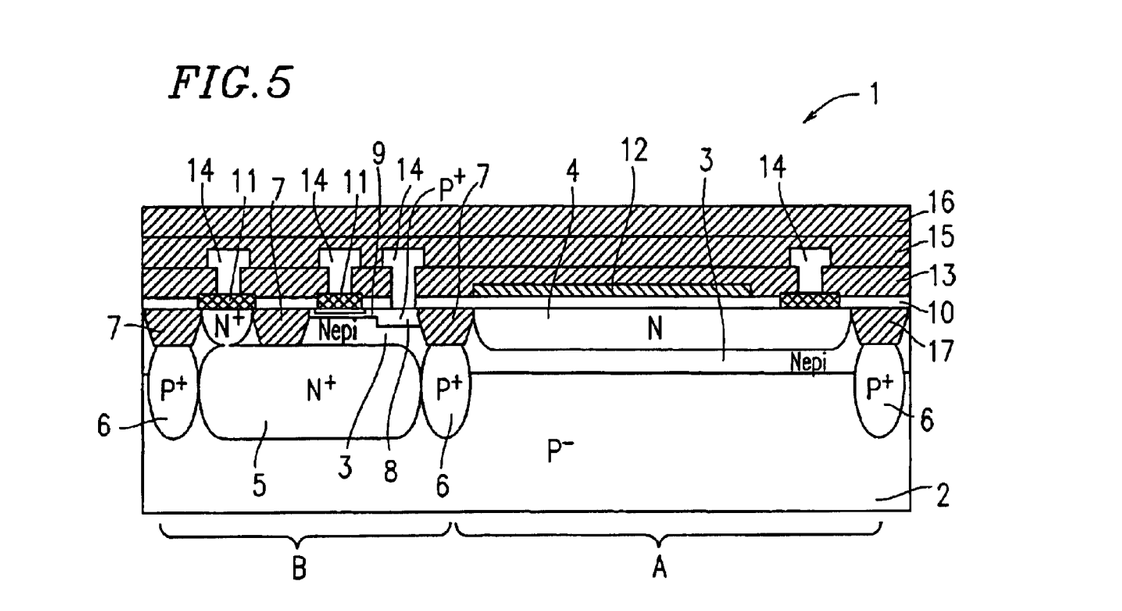
FIG. 5 is a cross-sectional view showing a conventional semiconductor device with a built-in light receiving element.

FIG. 5 is a cross-sectional view showing an exemplary structure of a conventional semiconductor device with a built-in light receiving element 1.

The semiconductor device with a built-in light receiving element 1 is constructed such that a photodiode region A, in which a photodiode (light receiving element) is provided, and an NPN transistor region B serving as a peripheral circuit region, are provided on a common P type silicon substrate 2.

The photodiode region A has an N type epitaxial layer 3 which is provided over an entire surface of the P type silicon substrate 2. In FIG. 5, the N type epitaxial layer 3 and the P type substrate 2 together form a PN junction surface. On the N type epitaxial layer 3, an N type cathode diffusion region 4 is provided in a predetermined region of the photodiode region A.

The transistor region B has an N+ buried diffusion layer 5 which is buried in a collector region on a surface of the P type silicon substrate 2. A P+ buried diffusion layer 6 is provided on each side of the N+ buried diffusion layer 5 so as to separate the photodiode region A from the transistor region B. An element separation layer 7 is provided on the N+ buried diffusion layer 5 and the P+ buried diffusion layer 6, ranging from a surface of the N type epitaxial layer 3 to the diffusion layers 5 and 6. A P type base region 8 is provided at a predetermined position of the N type epitaxial layer 3 provided on the N+ buried diffusion layer 5. An emitter region 9 is formed in a portion of the base region 8.

A silicon oxide layer 10 is provided over the photodiode region A and the NPN transistor region B having the above-described layers. This silicon oxide layer 10 serves as an anti-reflection film in the photodiode region A, while serving as an insulating film in the NPN transistor region B. The silicon oxide layer 10 is provided with openings on the N type epitaxial layer 3, the emitter region 9, and the base region 8 in the NPN transistor region B, and also with openings on the N type cathode diffusion region 4 in the photodiode region A. Among the openings, the openings on the N type epitaxial layer 3 and the emitter region 9 in the NPN transistor region B and the openings on the N type epitaxial layer 3 in the photodiode region A are provided with a polycrystalline silicon film 11 buried therein.

A silicon nitride film 12 (anti-reflection film) is provided on the silicon oxide layer 10 in the photodiode region A. An oxide film 13 is provided entirely on the silicon oxide layer 10 or the silicon nitride film 12 in the photodiode region A and on the silicon oxide layer 10 in the NPN transistor region B. This oxide film 13 is provided with openings which reach the polycrystalline silicon film 11 on the N type epitaxial layer 3 and the emitter region 9 in the NPN transistor region B. The silicon oxide layer 13 on the base region 8 is provided with openings ranging from a surface of the oxide film 13 via the silicon oxide layer 10 to the base region 8. Each opening is provided with a metal electrode 14.

An inter-wiring layer film 15 for protecting the metal electrodes 14 is provided on the oxide film 13 provided with the metal electrodes 14. A cover film 16 is provided on the inter-wiring layer film 15.

In assessment of the performance of photodiodes, photosensitivity is an important parameter. High values and small variations are required for the photosensitivity of photodiodes. To produce a photodiode which meets such a demand, it is desirable to provide an anti-reflection film comprising at least an oxide film and a nitride film.

In the semiconductor device with a built-in light receiving element shown in FIG. 5, the oxide film 13, the inter-wiring layer film 15, and the cover film 16 each are provided over the entire photodiode region A and the NPN transistor region B. However, photosensitivity can be further improved when an optical signal enters directly the anti-reflection film, compared to when an optical signal enters the anti-reflection film provided in the light receiving region of the photodiode region via the oxide film 13 and the like. Therefore, another semiconductor device with a built-in light receiving element has been proposed, in which openings are provided by removing upper layers, such as the oxide film 13 and the like, on the anti-reflection film by etching.

However, in the semiconductor device with a built-in light receiving element having such a structure, if the thickness of the anti-reflection film is considerably small, such as about 100 nm, and a surface of the anti-reflection film is exposed during a step of forming and removing an upper layer film, overetching may occur during such a step, resulting in a reduction in the thickness of the anti-reflection film. In the worst case, the anti-reflection film may be lost.

In addition, since the anti-reflection film has a considerably small thickness, damage (e.g., plasma or the like) occurring during the step of forming and removing the upper layer may reach the inside of the silicon layer, resulting in a large defect or the like. When such a large defect occurs, junction leakage is likely to occur in a division portion (not shown in FIG. 5) within the photodiode region A. In addition, the lifetime of light receiving elements may be reduced, leading to a decrease in photosensitivity. Thus, such a light receiving element is not preferable.

Such a problem has been measured by the following method. After formation of an anti-reflection film, an upper interlayer film thereon is kept. In a subsequent step, openings are formed over the anti-reflection film by utilizing a dry etching step which is concurrently performed to remove an IC protection film in a light receiving region.

However, usually only an oxide or nitride film can be used as an interlayer film. Therefore, in a step of removing an interlayer film, it is not possible to obtain a high selective ratio between a thin nitride film, which is provided as an upper layer film of an anti-reflection film, and an interlayer film. To avoid this situation, after the interlayer film is removed by a certain thickness by dry etching, a remaining oxide film has to be removed by wet etching.

Even in this process, it is necessary to employ a highly sophisticated etching control technique which suppresses lateral spread of wet etching. Thus, it is not easy to remove an interlayer film with high precision. In this case, imperfect etching or the like may adversely increase variations in the reflectance of an anti-reflection film.

SUMMARY OF THE INVENTION

According to an aspect of the present invention, a method for producing a semiconductor device with a built-in light receiving element is provided, in which the device comprises a light receiving element region for receiving and converting an optical signal to an electric signal, the light receiving element region being provided on a substrate. The method comprises the steps forming an anti-reflection film in the light receiving element region on the substrate, and forming a protection film, the protection film serving as an etch stop film in a subsequent etching step.

According to another aspect of the present invention, a method for producing a semiconductor device with a built-in light receiving element is provided, in which the device comprises a light receiving element region for receiving and converting an optical signal to an electric signal and a circuit element region for processing the electric signal obtained by the light receiving element region on the same substrate. The method comprises the steps forming an anti-reflection film in the light receiving element region on the substrate, and forming a protection film on the anti-reflection film for protecting the anti-reflection film from reduction of the thickness of the anti-reflection film due to overetching in a subsequent process and process damage.

In one embodiment of this invention, the method further comprises the step of removing the protection film.

In one embodiment of this invention, the anti-reflection film is an optical anti-reflection film comprising at least an oxide film and a nitride film, and the thickness of each of the oxide film and the nitride film is changed depending on the wavelength of light to be received.

In one embodiment of this invention, the protection film is made of a polycrystalline silicon film.

In one embodiment of this invention, in the step of forming the protection film, the polycrystalline silicon film on the anti-reflection film and the polycrystalline silicon film of a device layer in the circuit element region are formed in the same step.

In one embodiment of this invention, the device layer in the circuit element region is the emitter or the base of a bipolar transistor.

In one embodiment of this invention, the device layer in the circuit element region is the gate of a MOS transistor.

In one embodiment of this invention, the device layer of the circuit element region is a resistor device.

In one embodiment of this invention, the polycrystalline silicon film on the anti-reflection film is removed by wet etching or a combination of dry etching and wet etching.

In one embodiment of this invention, the wet etching for removing the polycrystalline silicon film on the anti-reflection film employs a solution containing ammonium oxide fluoride.

In one embodiment of this invention, the polycrystalline silicon film on the anti-reflection film contains a high concentration of impurity.

In one embodiment of this invention, the impurity contained in the polycrystalline silicon film on the anti-reflection film is phosphor.

In one embodiment of this invention, a region of the polycrystalline silicon film on the anti-reflection film overlapping an upper layer film is removed by side etching.

In one embodiment of this invention, a cathode electrode is formed of the polycrystalline silicon film provided in the light receiving element region.

In one embodiment of this invention, the polycrystalline silicon film on the anti-reflection film is separated from the polycrystalline silicon film on the cathode electrode.

According to another aspect of the present invention, a semiconductor device with a built-in light receiving element produced by the above-described method is provided.

According to another aspect of the present invention, an optical pickup comprising the above-described semiconductor device with a built-in light receiving element is provided.

Thus, the invention described herein makes possible the advantages of providing a method for producing a semiconductor device with a built-in light receiving element, in which it is possible to reduce a decrease in thickness of an anti-reflection film due to etching of a wafer and damage in processes without a large increase in the number of steps and a complicated process; a semiconductor device with a built-in light receiving element produced by such a method; and an optical pickup incorporating the semiconductor device with a built-in light receiving element.

These and other advantages of the present invention will become apparent to those skilled in the art upon reading and understanding the following detailed description with reference to the accompanying figures.

DESCRIPTION OF THE PREFERRED EMBODIMENTS

Hereinafter, a method for producing a semiconductor device with a built-in light receiving element according to the present invention will be described by way of illustrative examples with reference to the accompanying drawings.

EXAMPLE 1

FIGS. 1A to 1C, 2A to 2C and 3A to 3C are schematic cross-sectional views for explaining steps of a method for producing a semiconductor device with a built-in light receiving element according to the present invention. Note that in each figure, A indicates a photodiode region and B indicates an NPN transistor region.

Figure 1A:
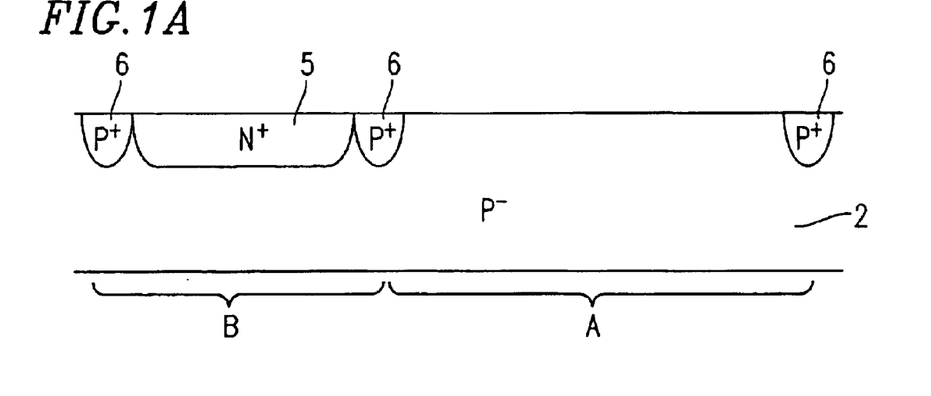
FIGS. 1A to 1C are schematic cross-sectional views for explaining a method for producing a semiconductor device with a built-in light receiving element according to Example 1 of the present invention.

Referring to FIG. 1A, an $N^+$ buried diffusion layer 5 is formed at a predetermined position, which will become an NPN transistor region B, on a surface of a P type silicon substrate 2 having a specific resistance of about 500 $\Omega$cm. Thereafter, a $P^+$ buried diffusion layer 6 for element separation is formed on each side of the $N^+$ buried diffusion layer 5. Note that in other regions on the surface of the P type silicon substrate 2, a $P^+$ buried diffusion layer (not shown) for a substrate electrode is formed in the same step of forming the $P^+$ buried diffusion layer 6.

Figure 1B:
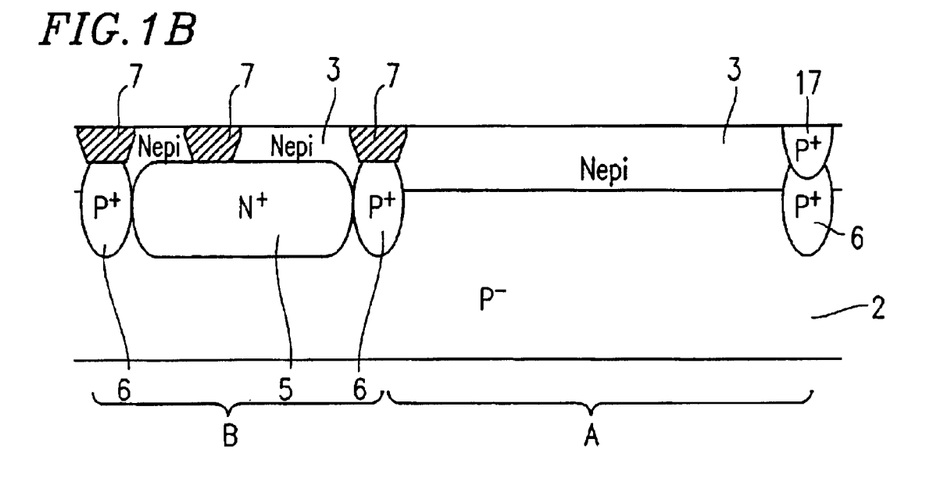

Thereafter, referring to FIG. 1B, a 2 $\mu$m thick N type epitaxial layer 3 having a specific resistance of about 1 $\Omega$cm is formed over an entire surface of the P type silicon substrate 2 provided with the $N^+$ buried diffusion layer 5 and the $P^+$ buried diffusion layer 6. A P type well diffusion layer 17 is formed in the region 6 of the photodiode region A in which a substrate electrode will be formed. A LOCOS process is conducted so that an oxide film (about 1 $\mu$m thick) is grown from the $N^+$ buried diffusion layer 5 on the NPN transistor region B and the $P^+$ buried diffusion layer 6 up to a surface of the N type epitaxial layer 3 to form an element separation layer 7.

Figure 1C:
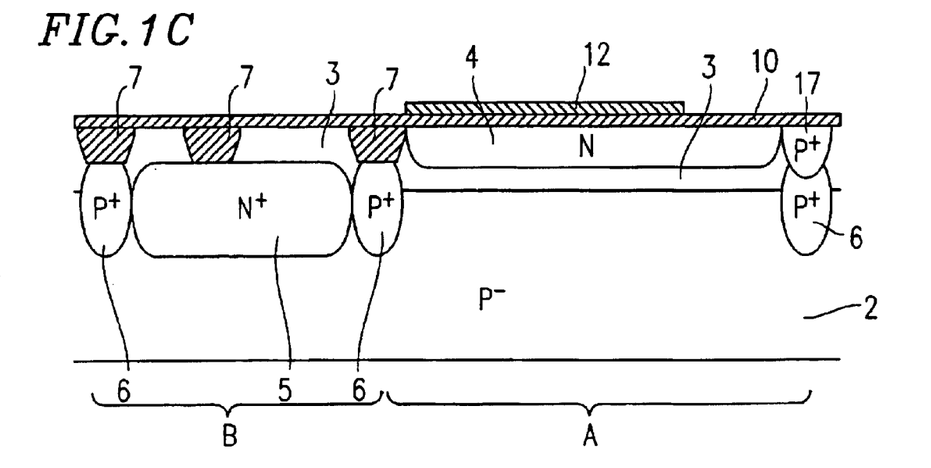

Thereafter, referring to FIG. 1C, a silicon oxide layer 10 having a thickness of about 30 nm is formed over an entire surface of the photodiode region A and the NPN transistor region B. An N type cathode region 4 is formed in a predetermined region of the photodiode region A. A predetermined concentration of phosphor is injected into the N type cathode region 4 by ion implantation. Boron is injected into a division portion region (not shown) by ion implantation. A silicon nitride film 12 having a thickness of about 55 nm is formed on the silicon oxide layer 10. The silicon nitride film 12 on a substrate electrode portion in the photodiode region A and in the NPN transistor region B is removed by etching. Note that the thicknesses of the silicon oxide layer 10 and the silicon nitride film 12 can be changed depending on the wavelength of light to be received.

Figure 2A:
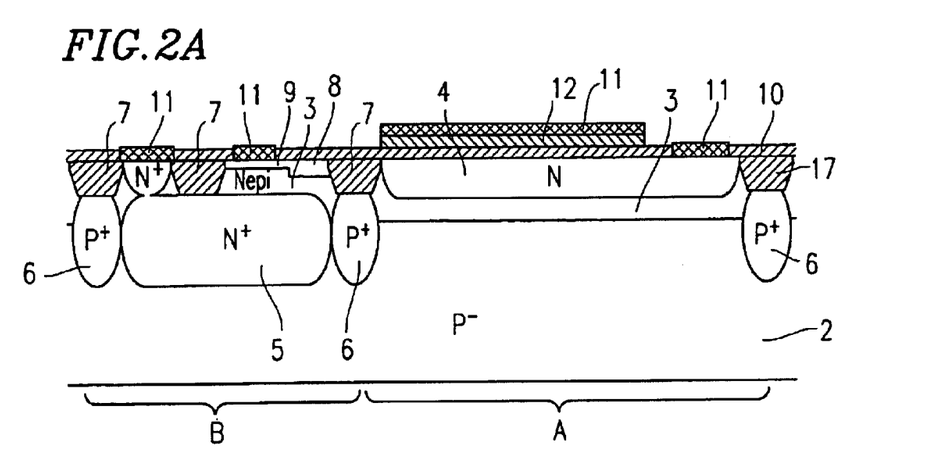
FIGS. 2A to 2C are schematic cross-sectional views for explaining a method for producing a semiconductor device with a built-in light receiving element according to Example 1 of the present invention.

Thereafter, referring to FIG. 2A, boron is introduced into a predetermined region of the NPN transistor region B by ion implantation to form a base region 8. An emitter region 9 is formed in a portion of the base region 8. Note that a region on the $N^+$ buried diffusion layer 5 which is not the base region 8 serves as a collector region.

Thereafter, openings are formed in portions of the silicon oxide layer 10 corresponding to the emitter region 9 and the collector region of the NPN transistor region B and the N type cathode diffusion region 4 of the photodiode region A. A polycrystalline silicon layer 11 having a thickness of about 300 nm is deposited over an entire surface of the substrate. Thereafter, the polycrystalline silicon film 11 is removed, leaving portions thereof which are deposited in the silicon nitride film 12, the openings in the collector region, the openings in the emitter region 9, and the openings in the N type cathode diffusion region 4. As a result, the silicon nitride film 12, which serves as an anti-reflection film for a photodiode, is entirely covered with the polycrystalline silicon film 11. In Example 1, the polycrystalline silicon film 11 covers the silicon nitride film 12 and, at the same time, in serves as a cathode electrode or the like in the N type cathode diffusion region 4. In such a case, a portion of the polycrystalline silicon layer 11 on the silicon nitride film 12 is previously separated from a portion of the polycrystalline silicon layer 11 which will become a cathode electrode.

Thereafter, phosphor is introduced by ion implantation onto portions of the polycrystalline silicon film 11 provided on the collector region in the NPN transistor region B, which will become a bipolar transistor, and the cathode electrode of the photodiode region A. Arsenic is introduced by ion implantation into the emitter region. Note that phosphor may be introduced into a portion of the polycrystalline silicon film 11 provided on the silicon nitride film 12 in the photodiode region A. By introducing phosphor into such a portion of the polycrystalline silicon film 11, the polycrystalline silicon film 11 on the silicon nitride film can be etched at a higher rate in a subsequent step, thereby making it easier to remove the polycrystalline silicon film 11.

Figure 2B:
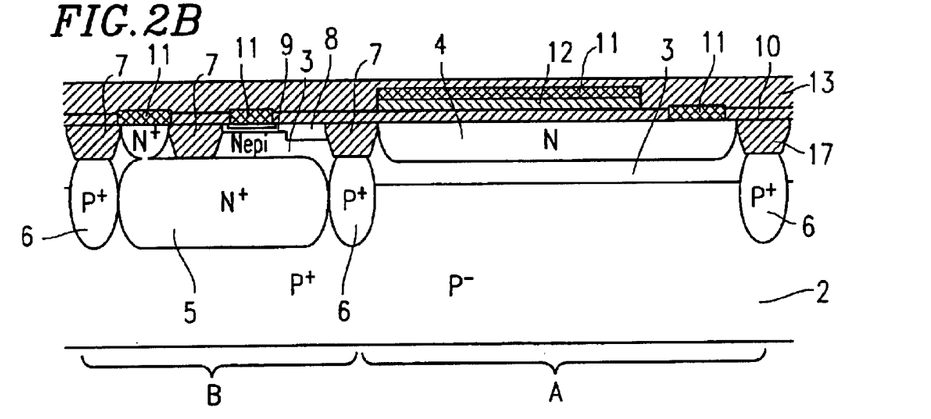

Thereafter, referring to FIG. 2B, an oxide film 13 is formed by CVD entirely on a surface of a wafer by CVD.

Figure 2C:
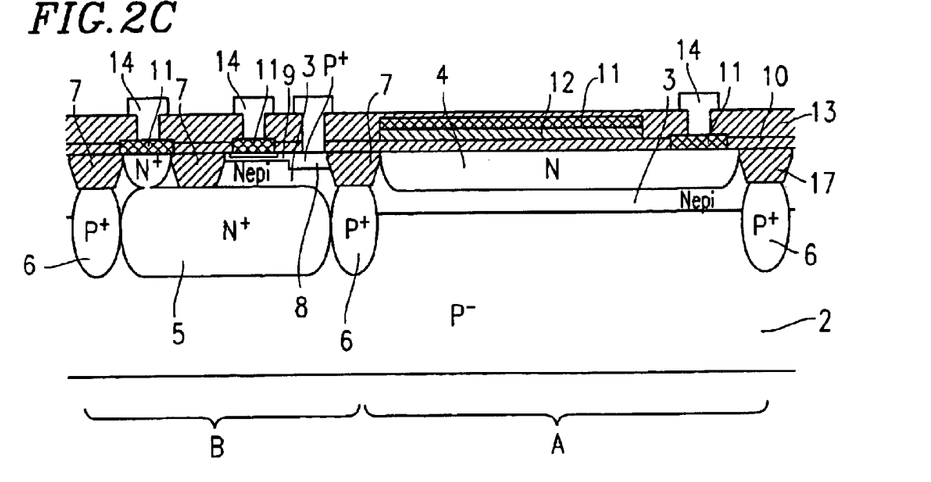

Thereafter, referring to FIG. 2C, openings which reach onto portions of the polycrystalline silicon film 11 on the collector region and the emitter region 9 in the NPN transistor region B, openings which reach onto the base region 8, and openings which reach onto the cathode electrode in the photodiode region A, are provided in the oxide film 13. A metal electrode 14 comprising a conductor layer is formed in each opening.

Figure 3A:
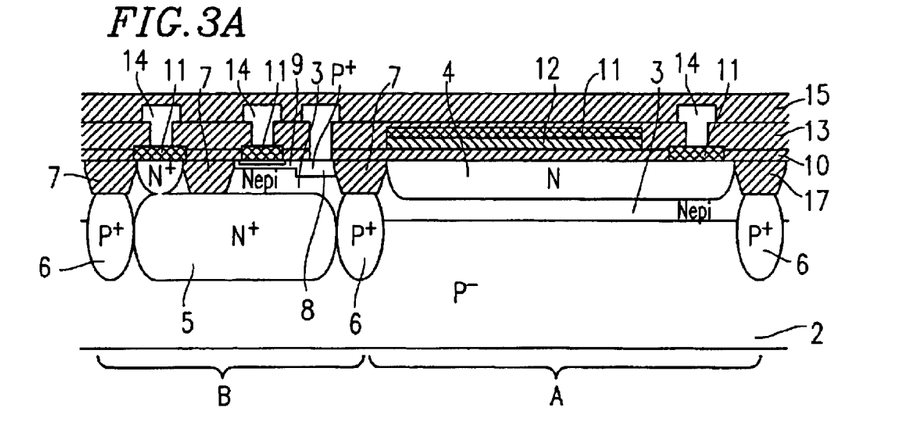
FIGS. 3A to 3C are schematic cross-sectional views for explaining a method for producing a semiconductor device with a built-in light receiving element according to Example 1 of the present invention.

Thereafter, referring to FIG. 3A, an inter-wiring layer film 15 is formed over the entire oxide film 13 provided with the metal electrode 14. A through hole portion (not shown) is formed in the inter-wiring layer film 15, and a second metal electrode (not shown) is formed.

Figure 3B:
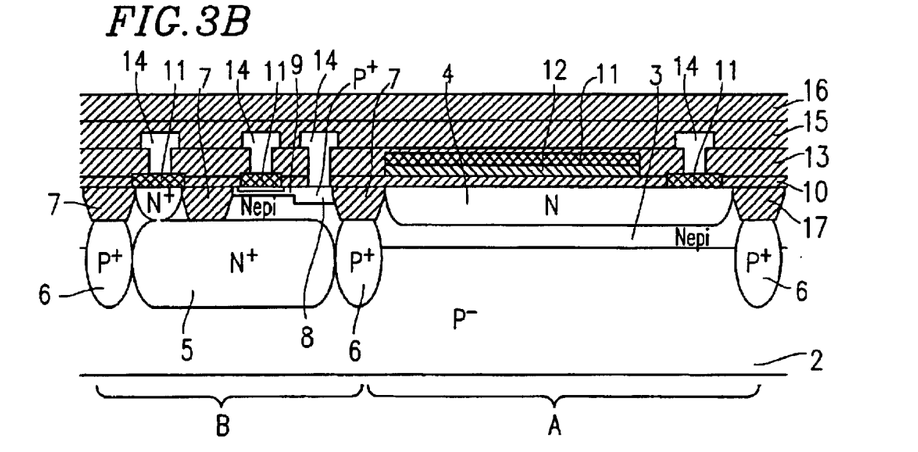

Thereafter, referring to FIG. 3B, a cover film 16 is formed over the entire inter-wiring layer film 15.

Figure 3C:
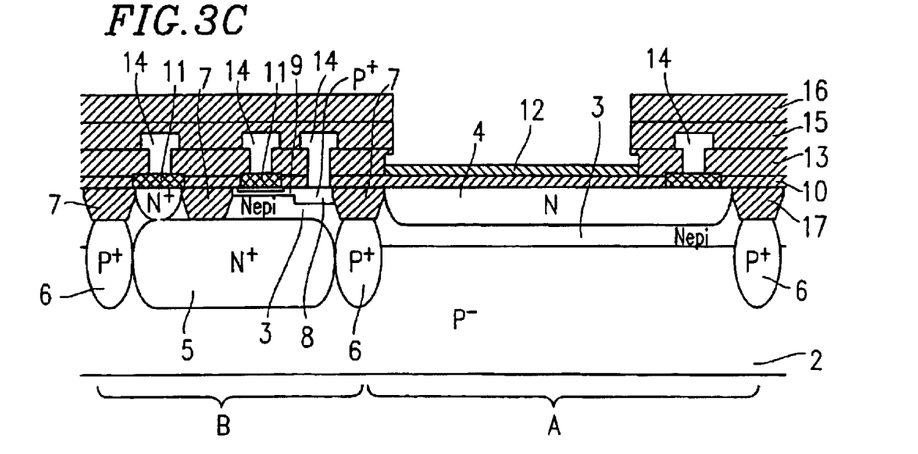

Thereafter, portions of the cover film 16 and the inter-wiring layer film 15 on the anti-reflection film are removed by dry etching to form openings. In this case, the selective etching ratio between the polycrystalline silicon film 11 on the silicon nitride film 12 and the oxide film 13, the inter-wiring layer film 15 and the cover film 16 can be 10 or more. Therefore, the polycrystalline silicon film 11 can serve as a stopper film in an etching step to protect the underlying silicon nitride film 12 sufficiently.

Thereafter, the polycrystalline silicon film 11 on the silicon nitride film 12 is removed by wet etching. In this case, by employing acidic solution containing ammonium oxide fluoride, a reduction in the thickness of the underlying silicon nitride film 12 (anti-reflection film) can be suppressed within about 1 nm even when side etching by overetching can be used to remove thoroughly the polycrystalline silicon film 11. Note that the polycrystalline silicon film 11 may be removed by a combination of dry etching and wet etching.

EXAMPLE 2

Figure 4A:
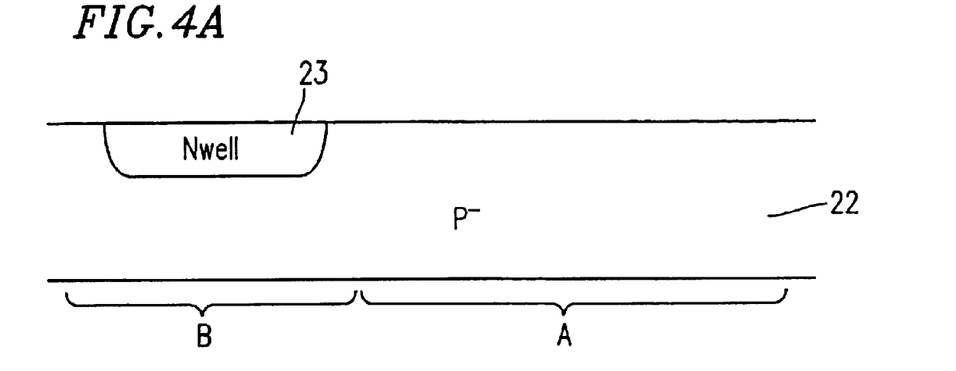
FIGS. 4A to 4C are schematic cross-sectional views for explaining a method for producing a semiconductor device with a built-in light receiving element according to Example 2 of the present invention.
Figure 4B:
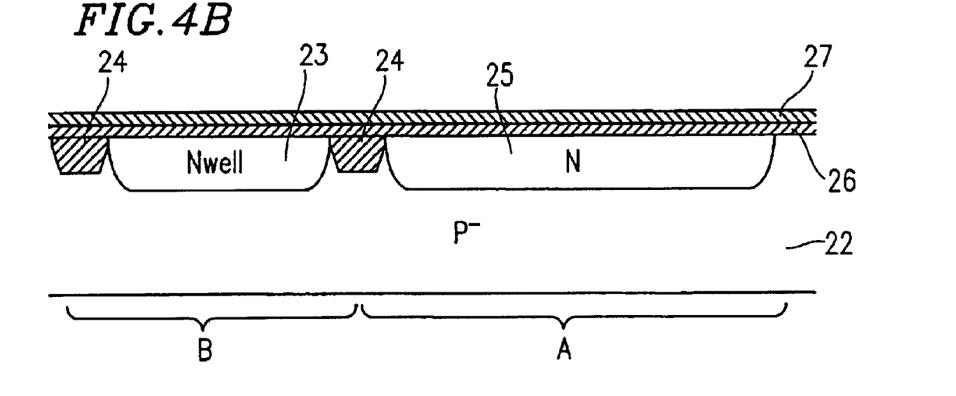
Figure 4C:
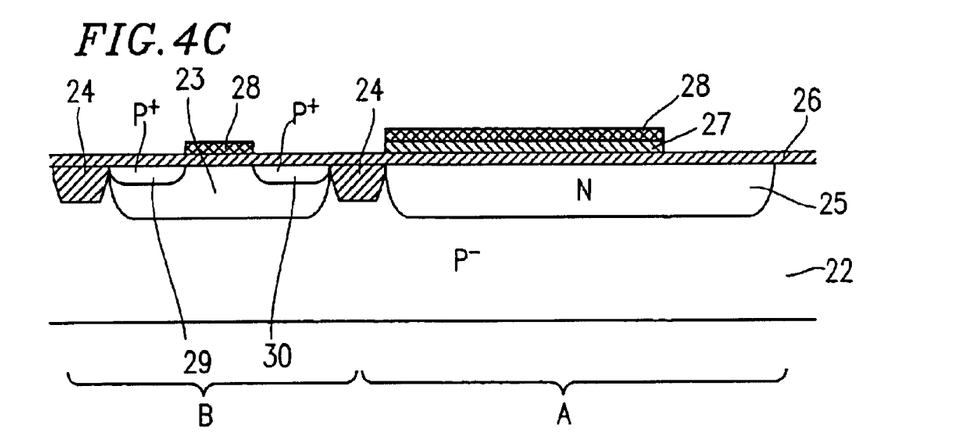

FIGS. 4A to 4C are schematic cross-sectional views showing each step in a process for producing a semiconductor device with a built-in light receiving element. Note that in the figures, A indicates a photodiode region and B indicates a Pch type MOS transistor region.

Referring to FIG. 4A, a P type silicon substrate 22 having a specific resistance of about 500 Ωcm is prepared as a substrate. An N type well diffusion layer 23 is formed at a predetermined position on the P type silicon substrate 22 which is to be a Pch type MOS transistor region B.

Thereafter, referring to FIG. 4B, a LOCOS process is carried out to form an element separation layer 24 on both sides of the N type well diffusion layer 23. An oxide film 26 having a thickness of about 30 nm is formed over the entire resultant structure to form an N type diffusion layer 25 in the photodiode region A. This N type diffusion layer 25 serves as a cathode region in the photodiode region A. After formation of the N type diffusion layer 25, a silicon nitride film 27 having a thickness of about 55 nm, which serves as an anti-reflection film, is formed on the silicon oxide layer 26.

Thereafter, referring to FIG. 4C, the silicon nitride film 27 is removed from the photodiode region A except for a region which will become a light receiving portion. A gate oxide film (not shown) is formed in the MOS transistor region B. Ions are injected into the MOS transistor region B to form a channel for controlling a threshold voltage $V_{th}$. A polycrystalline silicon film 28 having a thickness of about 300 nm is formed over the entire resultant structure. Thereafter, the polycrystalline silicon film 28 is removed from the MOS transistor region B except for portions thereof on the gate region and the anti-reflection film.

Thereafter, a predetermined impurity is introduced into the MOS transistor region B to form a source region 29 and a drain region 30.

Thereafter, the MOS transistor region B is formed via ordinary MOS process steps. Using the same method as described in Example 1, the oxide film is removed from the photodiode region A by dry etching. The polycrystalline silicon film 28 is removed by wet etching to form an opening as a light receiving portion in the photodiode region A.

As described above, in the method for producing a semiconductor device with a build-in light receiving element according to the present invention, a polycrystalline silicon film is formed on a nitride film (anti-reflection film) so that the polycrystalline silicon film is used as an etching stopper. By providing the polycrystalline silicon film on the anti-reflection film, a higher selective etching ratio with respect to an oxide film provided over the nitride layer is made possible. Therefore, it is unlikely that the anti-reflection film is lost due to overetching. Further, it is possible to avoid adverse influences, such as alteration of interface properties, variations in refractive index, and the like, due to processes such as a thermal process and the like. Thus, the anti-reflection film can be protected against process damage which may occur during processes. Furthermore, by wet etching using ammonium oxide fluoride, only the polycrystalline silicon film can be removed without damaging the nitride film (anti-reflection film) and reducing the thickness thereof substantially. As a result, it is possible to produce a light receiving element in which the photosensitivity thereof is satisfactory and variations in photosensitivity between each light receiving element are reduced.

The polycrystalline silicon film is made of polycrystalline silicon which is often used for IC processes, and therefore, can be concurrently used as a transistor region. For example, when a light receiving element is integrated with a bipolar transistor, the polycrystalline silicon is also concurrently used as a diffusion source and an electrode for the base or the emitter of the transistor. Alternatively, a light receiving element is integrated with a MOS transistor, the gate of the transistor can be made of the polycrystalline silicon. Furthermore, when a light receiving element is integrated with a BiCMOS transistor, the polycrystalline silicon is also concurrently used as the base, emitter, or gate of the transistor.

Therefore, the method for producing a semiconductor device with a built-in light receiving element according to the present invention can produce the devices with a high yield without increasing the number of steps and employing a complicated process.

Note that in Examples 1 and 2 described above, a polycrystalline silicon film provided for protecting an anti-reflection film from process damage is concurrently used to form an electrode in a transistor region. This polycrystalline silicon film may be used to form a resistor element.

Note that the semiconductor device with a built-in light receiving element of the present invention is obtained by a production method in which an anti-reflection film on a surface of a PD (photodiode) is protected with a polysilicon film (polycrystalline silicon film) used in a process for a high-speed transistor. Although not described above, in another embodiment, the semiconductor device with a built-in light receiving element of the present invention is mounted in an optical IC (OPIC), such as an optical pickup for high-speed CD-R/RW, an optical pickup for high-speed DVD-R/RW, and the like. In this case, it is possible to suppress film reduction and process damage due to etching during a wafer process for an anti-reflection film, resulting in an improvement in quality of IC chips.

Although not described above, Japanese Laid-Open Publication No. 2000-133833 discloses a technique in which a polysilicon film for the gate of a CMOS is also used as a photodiode. In contrast, in the present invention, after an anti-reflection film is formed, a polysilicon film (polycrystalline silicon film) is provided thereon; and the polysilicon film is removed in a subsequent etching step while protecting the photodiode. In the above-described publication, after a polysilicon film is provided to protect a photodiode, the polysilicon film is removed and then an anti-reflection film is formed. In this case, a high-performance anti-reflection film cannot be formed as compared to the anti-reflection film of the present invention.

The present invention provides a method for producing a semiconductor device with a built-in light receiving element, which device includes a light receiving element region for receiving an optical signal and converting it to an electric signal and a circuit element region for processing the electric signal obtained by the light receiving element region on the same substrate. The method comprises the steps of forming an anti-reflection film on the light receiving element region and forming a protection film for protecting the anti-reflection film from reduction of the thickness thereof due to overetching in a subsequent process, and process damage. Therefore, it is possible to decrease a reduction in the thickness of an anti-reflection film due to overetching during wafer processes, and process damage.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor device with a built-in light receiving element, wherein the device comprises a light receiving element region for receiving and converting an optical signal to an electric signal, the light receiving element region being provided on a substrate, the method comprising:

forming an anti-reflection film in the light receiving element region on the substrate;

forming a protection film over the anti-reflection film, the protection film serving as an etch stop film for protecting the anti-reflection film in a subsequent etching step;

forming at least one additional film over the protection film;

etching a light-receiving window in the at least one additional film over the light receiving element region so that said etching removes material down to the protection film wherein the protection film is located at the bottom of the window following said etching, so that the protection film protects the anti-reflection film from being etched during said etching of the light-receiving window; and thereafter removing the protection film completely from the bottom of the window.

2. A method for producing a semiconductor device with a built-in light receiving element, wherein the device comprises a light receiving element region for receiving and converting an optical signal to an electric signal and a circuit element region for processing the electric signal obtained by the light receiving element region on the same substrate, the method comprising;

forming an anti-reflection film in the light receiving element region on the substrate;

forming a protection film directly on the anti-reflection film for protecting the anti-reflection film from reduction of the thickness of the anti-reflection film due to overetching in a subsequent process and process damage;

forming at least one additional film over the protection film;

after the protection film and the at least one addition film have been formed, etching a light-receiving window in the at least one additional film over the light receiving element region so that said etching removes material down to the protection film wherein the protection film is located at the bottom of the window following said etching, so that the protection film protects the anti-reflection film from being etched during said etching of the light-receiving window; and thereafter removing the protection film completely from the bottom of the window.

3. A method according to claim 1, wherein the anti-reflection film is an optical anti-reflection film comprising at least an oxide film and a nitride film, and the thickness of each of the oxide film and the nitride film is changed depending on the wavelength of light to be received.

4. A method according to claim 1, wherein the protection film is made of a polycrystalline silicon film.

5. A method according to claim 2, wherein the protection film is made of a polycrystalline silicon film.

6. A method according to claim 5, wherein in the step of forming the protection film, the polycrystalline silicon film on the anti-reflection film and the polycrystalline silicon film of a device layer in the circuit element region are formed in the same step.

7. A method according to claim 6, wherein the device layer in the circuit element region is the emitter or the base of a bipolar transistor.

8. A method according to claim 6, wherein the device layer in the circuit element region is the gate of a MOS transistor.

9. A method according to claim 6, wherein the device layer of the circuit element region is a resistor device.

10. A method according to claim 4, wherein the polycrystalline silicon film on the anti-reflection film is removed by wet etching or a combination of dry etching and wet etching.

11. A method according to claim 5, wherein the step of removing the polycrystalline silicon film on the anti-reflection film employs wet etching or a combination of dry etching and wet etching.

12. A method according to claim 11, wherein the wet etching for removing the polycrystalline silicon film on the anti-reflection film employs a solution containing ammonium oxide fluoride.

13. A method according to claim 5, wherein the polycrystalline silicon film on the anti-reflection film contains a high concentration of impurity.

14. A method according to claim 13, wherein the impurity contained in the polycrystalline silicon film on the anti-reflection film is phosphor.

15. A method according to claim 11, wherein a region of the polycrystalline silicon film on the anti-reflection film overlapping an upper layer film is removed by side etching.

16. A method according to claim 5, wherein a cathode electrode is formed of the polycrystalline silicon film provided in the light receiving element region.

17. A method according to claim 16, wherein the polycrystalline silicon film on the anti-reflection film is separated from the polycrystalline silicon film on the cathode electrode.

* * * * *